(12) United States Patent
Klinkowstein et al.

(10) Patent No.: US 6,414,327 B1
(45) Date of Patent: Jul. 2, 2002

(54) METHOD AND APPARATUS FOR ION BEAM GENERATION

(75) Inventors: Robert E. Klinkowstein, Winchester; Ruth Shefer, Newton; Barbara J. Hughey, Lexington, all of MA (US)

(73) Assignee: Newton Scientific, Inc., Cambridge, MA (US)

( * ) Notice: Subject to any disclaimer, the term of this patent is extended or adjusted under 35 U.S.C. 154(b) by 0 days.

(21) Appl. No.: 09/395,580

(22) Filed: Sep. 14, 1999

Related U.S. Application Data (60) Provisional application No. 60/100,129, filed on Sep. 14, 1998.

(51) Int. Cl.[7] .......................... H01J 37/30; H01J 27/00
(52) U.S. Cl. ............................. 250/492.21; 250/423 R
(58) Field of Search ........................ 250/423 R, 492.21

(56) References Cited

U.S. PATENT DOCUMENTS

| | | | |
|---|---|---|---|
| 4,667,111 A | 5/1987 | Glavish et al. | 250/492.2 |
| 4,782,304 A | 11/1988 | Aitken | 250/423 R |
| 4,812,775 A | * 3/1989 | Klinkowstein et al. | 250/306 |
| 4,980,556 A | * 12/1990 | O'Connor et al. | 250/423 R |
| 5,120,956 A | * 6/1992 | Purser | 250/281 |
| 5,300,891 A | 4/1994 | Tokoro | 328/233 |
| 5,693,939 A | 12/1997 | Purser | 250/251 |
| 5,729,028 A | 3/1998 | Rose | 250/492.21 |

OTHER PUBLICATIONS

Application of Accelerators in Research and Industry; Part Two, Nov. 1996; Nove Ion Implanters For the Semiconductor Industry by Frank Sinclair, Robert Rathmell and Noriyuki Takahashi.

* cited by examiner

Primary Examiner—Bruce Anderson
(74) Attorney, Agent, or Firm—Samuels, Gauthier & Stevens, LLP (57) ABSTRACT

A method and apparatus for ion beam generation in which acceleration of an ion beam in a first accelerating tube to a high voltage terminal, followed by transport of the beam through the terminal without significant charge changing, and deceleration of the beam substantially to ground potential in a second accelerating tube. Since the terminal is maintained at high voltage, the beam optical characteristics between the ion source and the terminal are identical to those of normal tandem operation. The optical elements of the injector and accelerator beamline can therefore be adjusted to produce an focused beam envelope in the high voltage terminal, allowing the beam to propagate efficiently through an empty stripper canal. Since the beam, does not undergo a charge change in the terminal, it is decelerated in the second tandem accelerating tube. Since the beam propagates through the accelerator at energies higher than the injection energy, expansion of the beam due to space charge and emittance is reduced.

43 Claims, 10 Drawing Sheets

METHOD AND APPARATUS FOR ION BEAM GENERATION

PRIORITY INFORMATION

This application claims priority from provisional application Ser. No. 60/100,129 filed Sep. 14, 1998.

BACKGROUND OF THE INVENTION

This invention relates to a method and apparatus for producing ion beams for use in semiconductor processing and manufacturing.

In recent years there has been increasing interest in the use of both very low energy (about 500 eV to about 60 keV) and very high energy (about 200 keV to about 3 MeV) ion beams (typically boron, phosphorus, and arsenic) for ion implantation for semiconductor processing. These beams complement the medium energy (about 60 keV to about 200 keV) ion beams that are already widely available for this application. Since space is very limited in semiconductor processing facilities, and because equipment costs are high, a single implanter capable of covering the full ion energy range described above would be extremely desirable.

High energy ion beams may be produced using either tandem accelerators or radio frequency (RF) accelerators. Tandem accelerators have the advantage that they are very energy efficient when compared with RF accelerators. It would therefore be desirable to provide a tandem accelerator for ion implantation over a wide range of ion energies.

SUMMARY OF THE INVENTION

In order to achieve the delivery of high currents at low energy with a tandem accelerator-based ion implanter, the invention provides for acceleration of an ion beam in a first accelerating tube to a high voltage terminal, followed by transport of the beam through the terminal without significant charge changing, and deceleration of the beam substantially to ground potential in a second accelerating tube. Since the terminal is maintained at high voltage, the beam optical characteristics between the ion source and the terminal are substantially identical to those of normal tandem operation. The optical elements of the injector and accelerator beamline can therefore be adjusted to produce an optimally focused beam envelope in the high voltage terminal, allowing the beam to propagate efficiently through an empty stripper canal. Since the beam is not stripped in the terminal, it is decelerated in the second tandem accelerating tube. Since the beam propagates through the tandem accelerator at energies higher than the injection energy, expansion of the beam envelope due to space charge and emittance is reduced.

In addition, in this mode of operation the beam optical parameters of the first and second accelerating tubes can be adjusted to further compensate for emittance and space charge effects. The beam reaches the grounded exit beamline of the accelerator with an energy substantially equal to the injection energy. Injection energies can be in the range between about 100 eV to about 250 keV. Thus, means are provided for efficiently delivering a low energy, high current ion beam through a tandem accelerator. To allow efficient transport of the ion beam from the accelerator exit to the process chamber, means are also provided for transporting the beam at an energy somewhat higher than the injection energy and decelerating the beam to substantially the injection energy at a location close to the point of use. Alternately, a somewhat higher injection energy can be used and the exiting beam can be further decelerated to energies below the injection energy near the point of use.

DETAILED DESCRIPTION OF THE INVENTION

Figure 1:
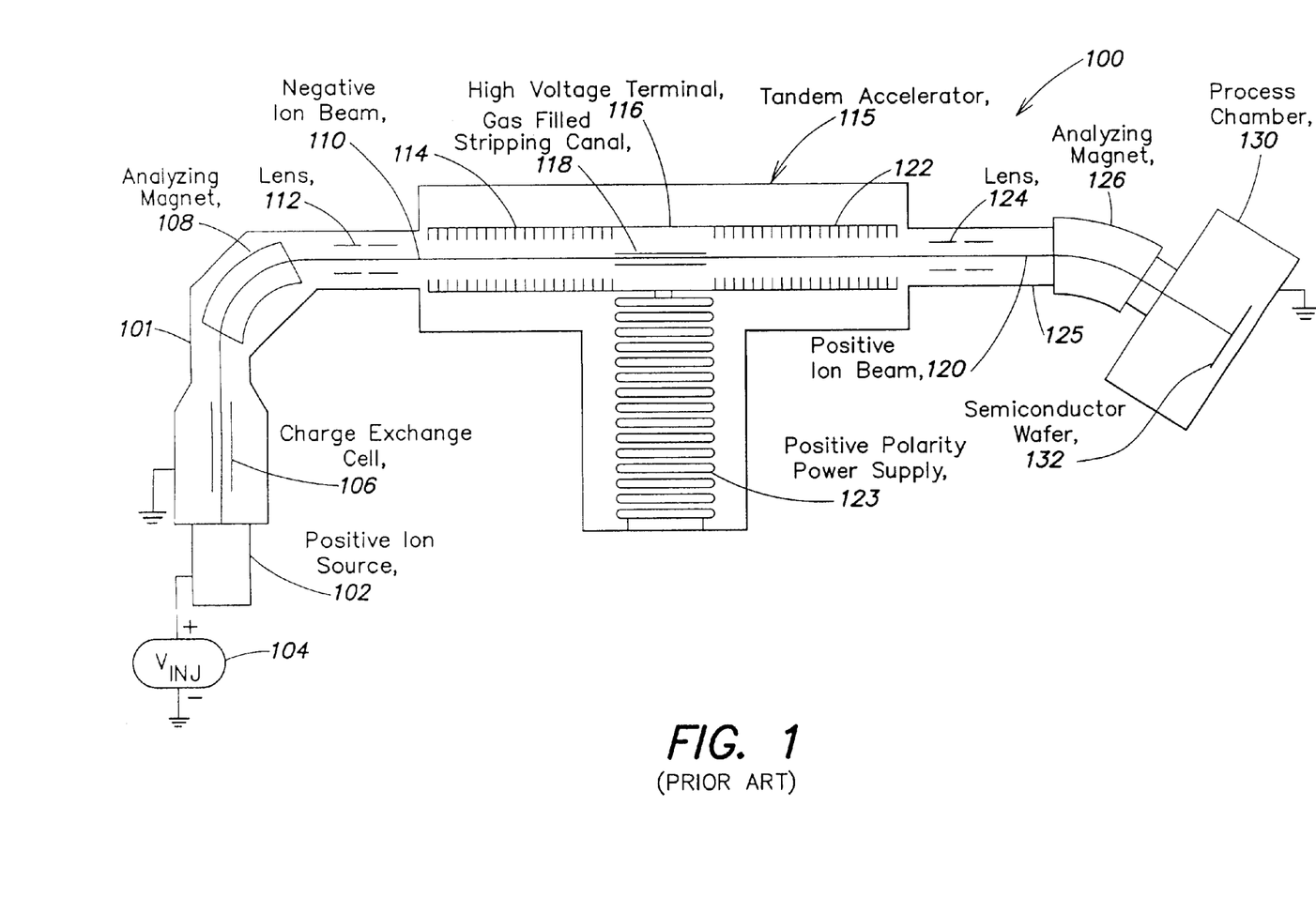
FIG. 1 is a functional block diagram of a tandem accelerator-based ion implanter 100.

FIG. 1 is a functional block diagram of a tandem accelerator-based ion implanter 100. The principles of tandem acceleration are well known. A negative ion beam is accelerated to a high voltage terminal maintained at a positive potential, stripped of two or more electrons in the terminal, and the resulting positive ion beam is accelerated back to ground potential. The final energy of the ion beam at the accelerator output is given by:

$$E_f = E_{inj} + e(1+Q)V_{term}$$

where $E_{inj}$ is the injection energy, $V_{term}$ is the terminal voltage, e is the magnitude of the electron charge, and Q the electronic charge state of the ion when it leaves the high voltage terminal.

Positively-charged ions are formed in a positive ion source 102, which is typically held at a positive potential 104 of several tens of kilovolts relative to ground potential.

Ions are extracted from the source under the action of an electric field, and transported to an entrance beamline 101 a charge exchange (adder) cell 106 where a fraction of the positive ions are converted to a beam 110 of negative ions. The negative ions are then further transported through an analyzing magnet 108 and focusing lens 112 to the entrance of a first accelerating tube 114 of a tandem accelerator 115. The negative ions are accelerated in the first tube to a high voltage terminal 116 maintained at a positive potential with the aid of a positive polarity power supply 123. There, they pass through a gas-filled stripping canal 118 where they are stripped of two or more electrons in order to effect a charge change.

A beam 120 of positively charged ions exiting the canal are further accelerated in a second accelerating tube 122. Upon exiting the second tube, the ions pass to an exit beamline 125 and may be further focused using an ion lens 124 and mass-analyzed by an analyzing magnet 126 to remove unwanted masses and charge states. The beam 120 then enters a process chamber 130, where it is directed onto a semiconductor wafer 132 held at, or close to, ground potential.

The negative ion beam is usually produced by first extracting a positive ion beam from an ion source, accelerating the positive ions to a predetermined energy $E_{inj}$ in the range 10 keV –200 keV, and then passing the positive ions through the charge exchange cell. In most tandem accelerators used in ion implanters, the ion source is electrically isolated from accelerator ground and held at a positive voltage $V_{inj}$. The injection energy $E_{inj}$ is then given by the product of $V_{inj}$ and the ion charge state. Stripping of the negative ion beam in the high voltage terminal is accomplished by sending the ion beam through a thin foil or gas-filled canal. Typically, several ion charge states are produced in the stripping process, with the relative fractions of the different charge states depending primarily on the ion energy in the high voltage terminal.

When a tandem accelerator is used in an ion implanter, the useful energy range of the implanter is limited by the minimum energy that can be efficiently stripped in the high voltage terminal. For boron, for example, the fraction of ions stripped to a positive charge state drops rapidly as the final beam energy is decreased below about 500 keV. Similar behavior is observed for the other ion species of interest. If only a small fraction of the injected ion beam is converted to positive ions in the terminal, a correspondingly small fraction of the injected beam current will reach the accelerator exit. In addition to the decrease in stripping efficiency with decreasing energy, scattering effects in the stripping gas becomes more pronounced at lower beam energies. Scattering of the ion beam in the stripper increases the size of the beam envelope, leading to collection of ions on apertures in the terminal and in the second accelerating tube. This effect also results in a reduction in the current that reaches the accelerator exit. Consequently, a conventional tandem accelerator cannot efficiently deliver the high currents desired for implantation at energies below about 500 keV.

Several approaches have been proposed to extend the useful energy range of tandem-accelerator- based ion implanters to low energies. These include operation of the tandem in a zero-terminal-voltage mode, or in a neutral injection mode, depending on the final energies desired.

In the zero-terminal-voltage mode, a positive ion beam is extracted from the ion source at energies up to about 60 keV (the injection energy) and then allowed to traverse the entire length of the accelerator without further acceleration. No voltage is applied to the high voltage terminal and no stripping gas is introduced into the terminal stripping canal. The beam exits the accelerator at the injection energy, and is directed through the exit beamline to the process chamber. This approach has the disadvantage that the positive ion beam must traverse a long path at very low energy, during which time it is subject to expansion due to space charge forces and emittance. Furthermore, the strong focusing effect of the accelerating tube entrance gradient is absent. Because of these two factors, the optical properties of the beam in the zero-terminal-voltage mode are substantially different from the optics under normal tandem acceleration.

Since the beam is poorly focused and because it expands due to emittance and space charge forces while traversing the tandem accelerator and the exit beamline, beam ions may be collected on apertures and constrictions within the accelerating tubes, stripper canal and exit beamline. Beam envelope growth due to both space charge and emittance effects become more rapid with increasing beam current. Therefore, the defect occurs that the ion beam current delivered to the process chamber is very limited in this low energy mode of implanter operation. Since high ion currents (up to 10 mA or more) are often required for low energy implants, this defect limits the usefulness of tandem accelerator-based implanters operating at low energies.

Figure 2A:
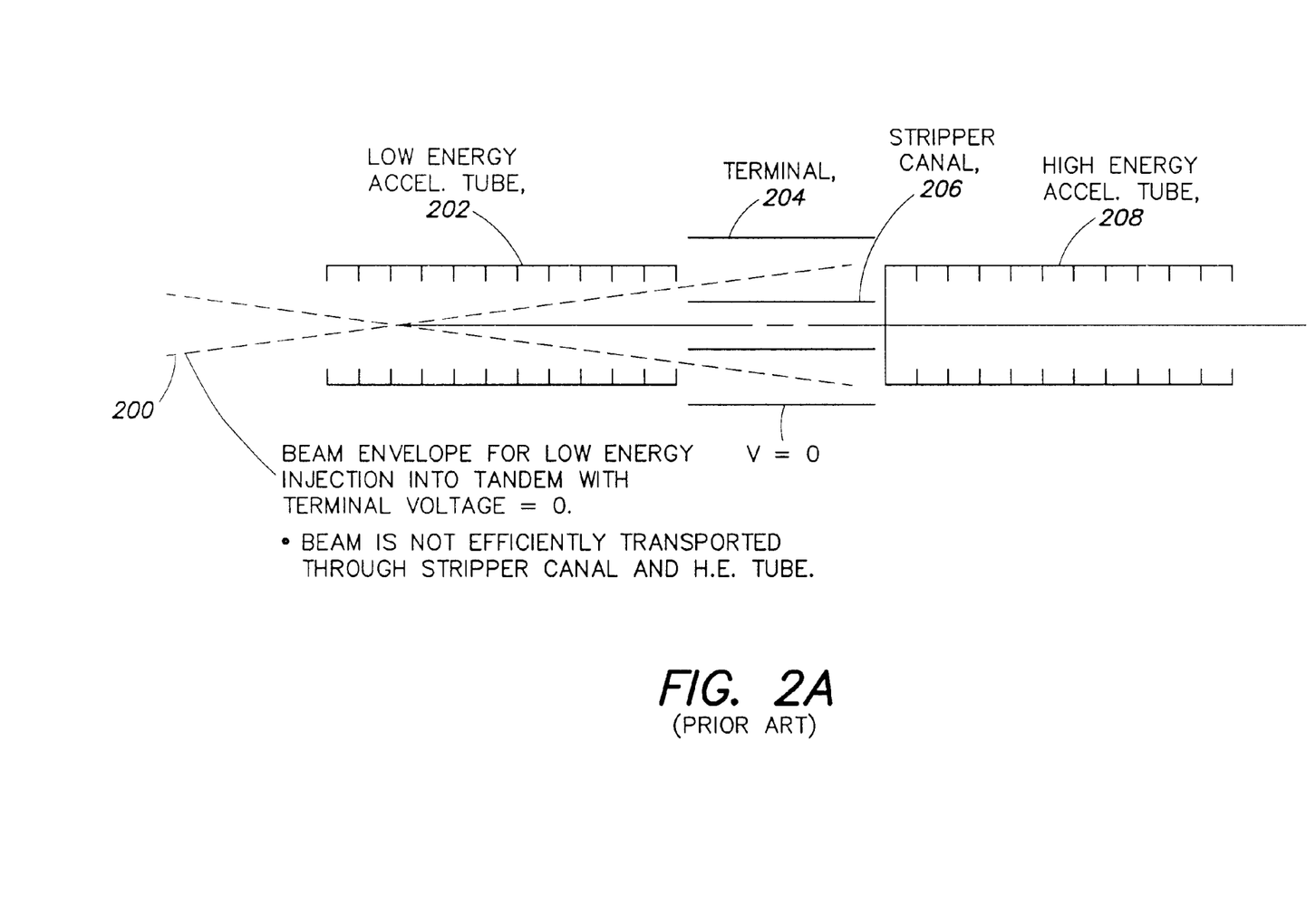
FIG. 2A is a schematic diagram of the conventional technique of zero-terminal-voltage mode of tandem operation.

FIG. 2A is a schematic diagram of the conventional technique of zero-terminal-voltage mode of tandem operation in which a high current, low energy ion beam envelope 200 is subject to expansion as it propagates through a tandem accelerating column having a low energy acceleration tube 202, a high voltage terminal 204, a stripper canal 206 and a high energy acceleration tube 208, with the terminal voltage held at ground potential. In this mode of operation, the beam envelope expands under the influence of space charge and emittance. Beam may be lost along the length of the accelerating column, resulting in only a fraction of the beam reaching the exit of the accelerator.

Figure 2B:
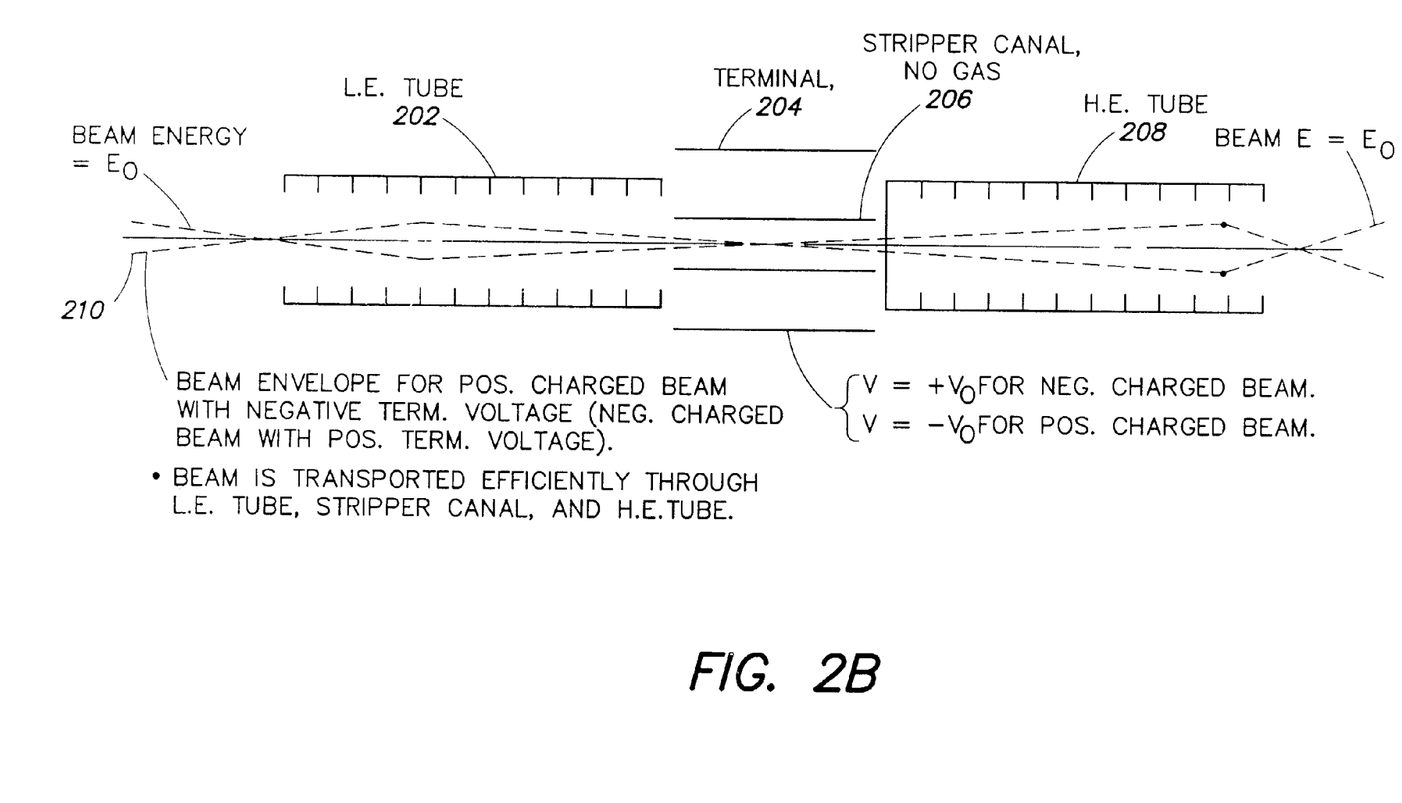
FIG. 2B is a schematic diagram of the method of the invention for delivering high current, low energy ion beams.

FIG. 2B is a schematic diagram of the method of the invention for delivering high current, low energy ion beams in which a low energy positive (negative) ion beam 210 is accelerated to the terminal 204 held at negative (positive) high voltage, exits the terminal without significant charge changing or stripping, and is decelerated to substantially the original injection energy at the accelerator exit. In accordance with the invention, the ion beam is transported efficiently through the accelerator terminal by adjusting the magnitude of the terminal voltage and the electric field gradients at the entrance and exit of the first 202 and second 208 accelerating tubes. If an empty stripping canal exists in the beam path in the accelerator terminal, the beam can be focused to allow it to pass unimpeded through the canal. Alternately, the beam can be made to pass through the high voltage terminal 204 without passing through the stripping canal 206. After exiting the accelerator, the beam can be further focused or defocused using conventional ion optics. In this mode of operation, the beam envelope is transported efficiently through the accelerator, with a large percentage of the injected current reaching the accelerator exit.

In accordance with one exemplary embodiment of the invention, a positive ion beam is produced and injected into the first accelerating tube of a tandem accelerator at an energy $E_{inj}$. The positive ion beam can be extracted directly from a conventional ion source used for ion implantation such as a PIG, Freeman, or a Bernas source, or from any other type of ion source capable of providing the desired positively charged ion species. If a charge exchange cell is normally positioned in the injection beamline, as shown in FIG. 1, then the cell is either operated with no charge exchange gas, or means are provided to remove the cell from the beam path or to divert the beam path so that substantially no charge exchange interactions occur. The positive ion beam is mass and charge analyzed and the desired mass(es) and charge state(s) are injected into the tandem accelerating column with the terminal maintained at negative high voltage.

The magnitude of the terminal voltage is preferably a voltage typical of the normal high energy operating mode of the tandem accelerator (between about 200 kV and about 1 MV), however, lower terminal voltages may also be used. The high voltage terminal may, or may not, contain a stripping canal in the path of the ion beam. If a stripping canal exists in the beam path, then no stripping gas is introduced into the stripping canal. The beam is accelerated to the terminal, reaching an energy $E_{term}=E_{inj}+qV_{term}$, where q is the electronic charge of the injected ions. The beam is then decelerated in the second accelerating tube and reaches a final energy substantially equal to $E_{inj}$ at the accelerator exit. Here, the beam may be further focused (defocused) and decelerated (accelerated), if desired, and delivered to the process chamber.

This embodiment has the advantage that the positive beam from the ion source is used directly without conversion to a negative ion beam, thereby removing the inefficiency of conversion to negative ions. The efficiency of conversion of positive B, P, or As ions to negative ions in a charge exchange canal is typically about 10%. The tandem accelerator terminal must be operated at a voltage with negative polarity, whereas normal operation is at positive polarity. This requires either that the polarity of the high voltage power supply be switchable as in a bipolar power supply, or that a separate negative polarity high voltage power supply be provided in addition to the positive polarity supply normally provided. An example of a configuration that uses a separate negative power supply is shown in FIG. 3, but other configurations are also possible.

Figure 3:
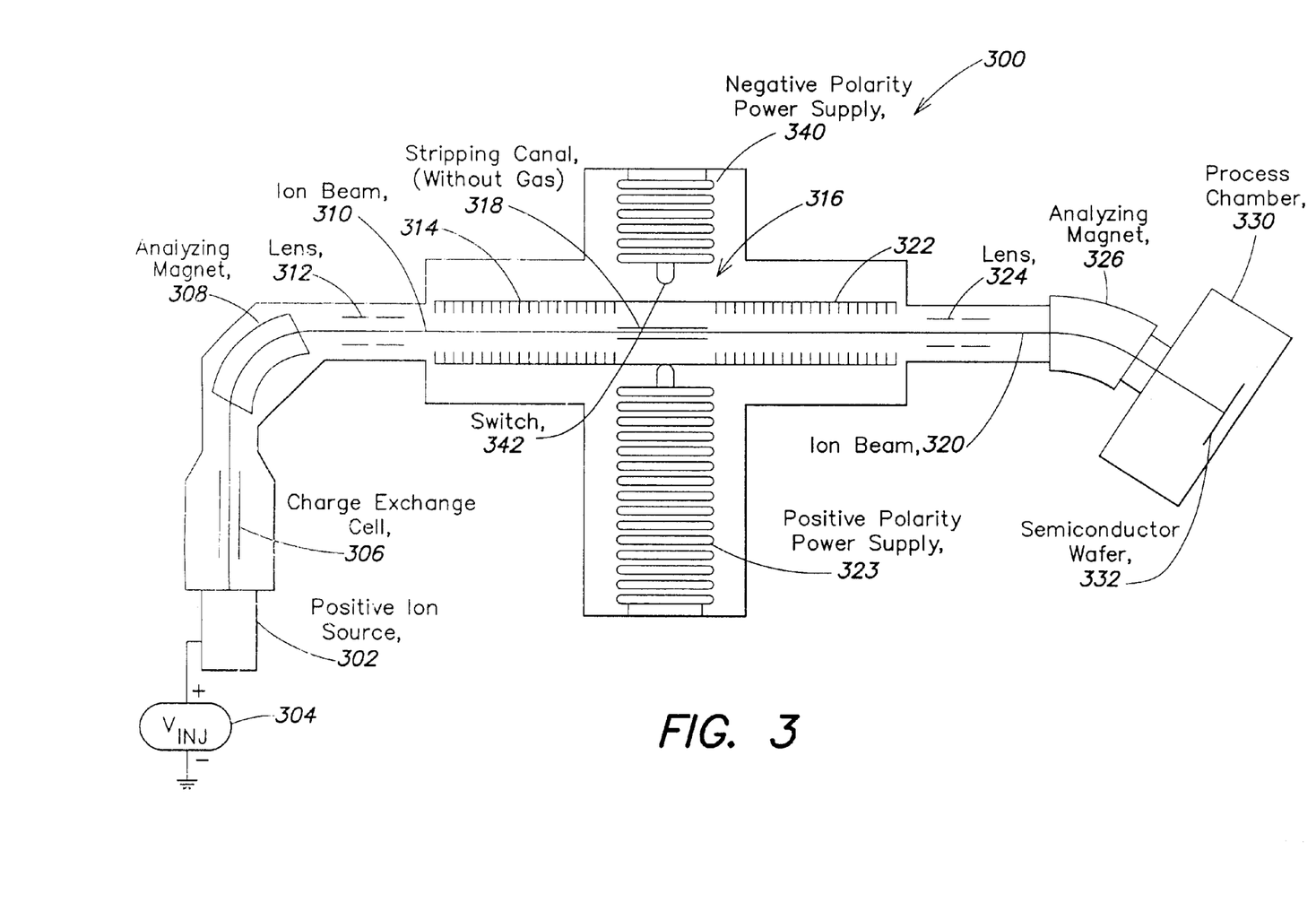
FIG. 3 is a functional block diagram of a tandem accelerator-based ion implanter capable of delivering either positively or negatively charged high current ion beams at low energies.

FIG. 3 is a functional block diagram of a tandem accelerator-based ion implanter 300 capable of delivering either positively or negatively charged high current ion beams at low energies to a process chamber 330. The tandem accelerator-based ion implanter 300 has both a positive polarity 323 and a negative polarity 340 high voltage power supply. In the positive-terminal mode of operation, the positive polarity power supply 323 is connected to the high voltage terminal 316 (with the negative polarity power supply disconnected), the charge exchange cell 306 is operated with charge exchange gas and the stripping canal 318 is operated without stripping gas. Positive ions from the ion source are converted to negative ions in the charge exchange cell, accelerated to the high voltage terminal, and decelerated to the accelerator exit where they emerge with energy substantially equal to the injection energy. The ions are then transported to the process chamber 330.

In the negative-terminal mode of operation, the negative polarity power supply 340 is connected to the high voltage terminal 316 (with the positive polarity power supply 323 disconnected), the charge exchange cell 306 is operated without charge exchange gas and the stripping canal 318 is operated without stripping gas. Positive ions leave the ion source and enter the grounded injection beamline with energies equal to the ion charge state times the injection voltage ($qxV_{inj}$, where q=1,2,3, etc.). The ions pass through the empty charge exchange cell, after which a single mass and energy is selected in the analyzing magnet 308. The selected ions are then accelerated to the high voltage terminal 316 where they pass through the empty stripping canal.

After they pass through the stripping canal 318, they are decelerated to the accelerator exit, and transported to the process chamber 330 with a residual energy equal to the injection energy. The advantage of the second mode of operation is that the inefficiency of conversion of positive to negative ions is eliminated since the positive ions are used directly.

When a separate power supply is used, means must be provided to connect the accelerator terminal 316 to either the positive 323 or negative 340 high voltage supply. A mechanical or electrical switch 342 can provide such means so long as the required distances between the switch terminals are not prohibitively large. For example, a switch operating in about 100 psia of sulfur hexafluoride gas within the accelerator pressure vessel would require a spacing between terminals of about 3 inches for power supply voltages of up to about 1 MV. Alternatively, the system can be operated without physically disconnecting the power supply which is not in use. In this case, both the positive 323 and negative 340 power supplies would be connected to the accelerator terminal and only the desired power supply would be energized, with the other power supply turned off.

It is a characteristic of the invention that the negative voltage power supply 340 need not be capable of reaching the same high voltage magnitude as the positive voltage tandem power supply 323. Thus, the negative power supply may have a considerably lower voltage capability than the positive power supply and still perform the function of providing efficient beam transport along the length of the accelerating column. In addition, the negative voltage power supply need not be of the same type or construction as the positive voltage power supply. Examples of suitable types of negative power supplies are a series-fed multiplier type, a parallel-fed multiplier type, an insulating core transformer type, or a conventional transformer-rectifier type power supply. However, any type of high voltage power supply with sufficient current and voltage capability can be used. Any of these power supply types can also be used to provide positive high voltage to the accelerator terminal.

In accordance with another exemplary embodiment of the invention, a negative ion beam is produced and injected into the first accelerating tube at an energy $E_{inj}$, as in normal tandem accelerator operation. The negative ion beam can be produced using a positive ion source in conjunction with a charge exchange cell, as shown in FIG. 1. Alternately, the negative ion beam can be produced in any other type of ion source capable of delivering the desired negatively charged ion species. The negative ion beam is accelerated to a positive high voltage terminal. Again, the magnitude of the terminal voltage is preferably a voltage typical of the normal high energy operating mode of the tandem accelerator (between about 200 kV and about 1 MV), but lower voltages can also be used.

The beam passes through the high voltage terminal without stripping. As in the previously described embodiment, the high voltage terminal may, or may not, contain a stripping canal in the path of the ion beam. If a stripping canal exists in the beam path, then no stripping gas is introduced into the stripping canal. Since the beam leaves the terminal negatively charged, it is decelerated in the second accelerating tube and exits the accelerator at an energy substantially equal to $E_{inj}$. The negative ion beam is then delivered to the implantation chamber, with or without further focusing and/or deceleration. Negative ions are equally useful for ion implantation as positive ions, and in some case negative ions may be preferred over positive ions.

This embodiment has the advantage that the tandem accelerator terminal and injection optics are operated in the normal voltage polarity, and no separate power supplies or high voltage switches are required. The positive ion beam is converted to negative ions in the injector, with the usual substantial loss in ion current.

The exemplary embodiments of the invention described above can incorporate standard electrostatic accelerating tubes. Examples of manufacturers of such tubes are Vivirad High Voltage Corporation (Billerica, Mass.), High Voltage Engineering Europa B.V. (Amersfoort, The Netherlands), and National Electrostatics Corporation (Middleton, Wis.). Preferably, magnetically suppressed accelerating tubes are used instead of the inclined field accelerating tubes used in many tandem accelerators. The use of magnetically suppressed tubes allows the ion beam to traverse the entrance and exit regions of the accelerating column at low energies without significant deflection of the ion trajectories. Alternately, inclined field tubes with straight (non-inclined) sections at the entrance region of the first tube and the exit region of the second tube could be used. The lengths of the straight sections will depend on the overall lengths of the tubes, the maximum terminal voltage and the electric field gradients in the tubes during low energy operation.

Figure 4A:
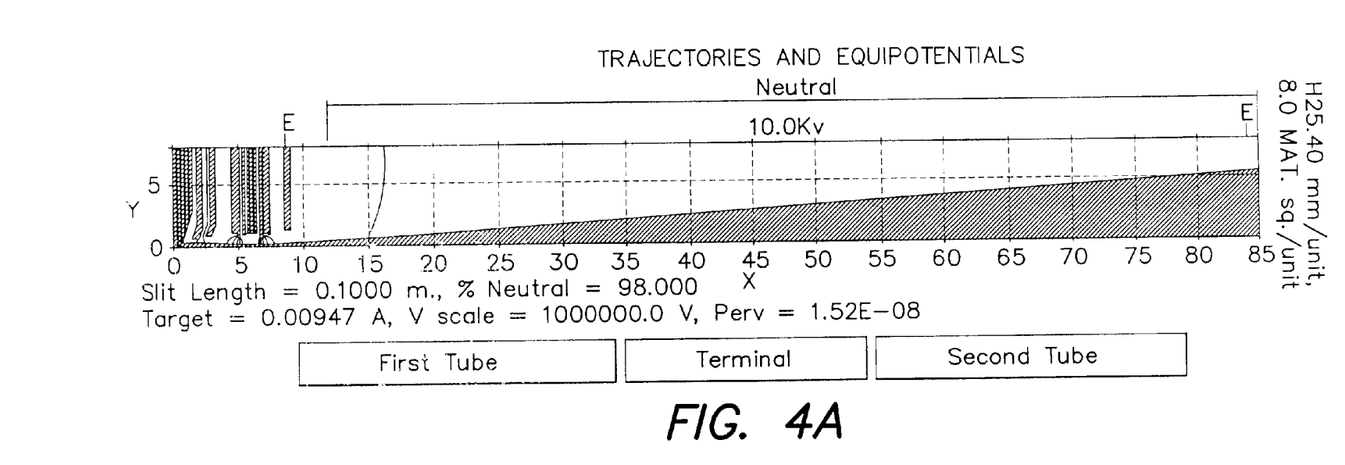
FIG. 4A is a graph showing a sample case in which a 10 keV, 9.5 mA singly charged boron beam with an emittance of 70 π-mm-mrad and 98% space charge neutralization is injected into a typical tandem accelerating column.
Figure 4B:
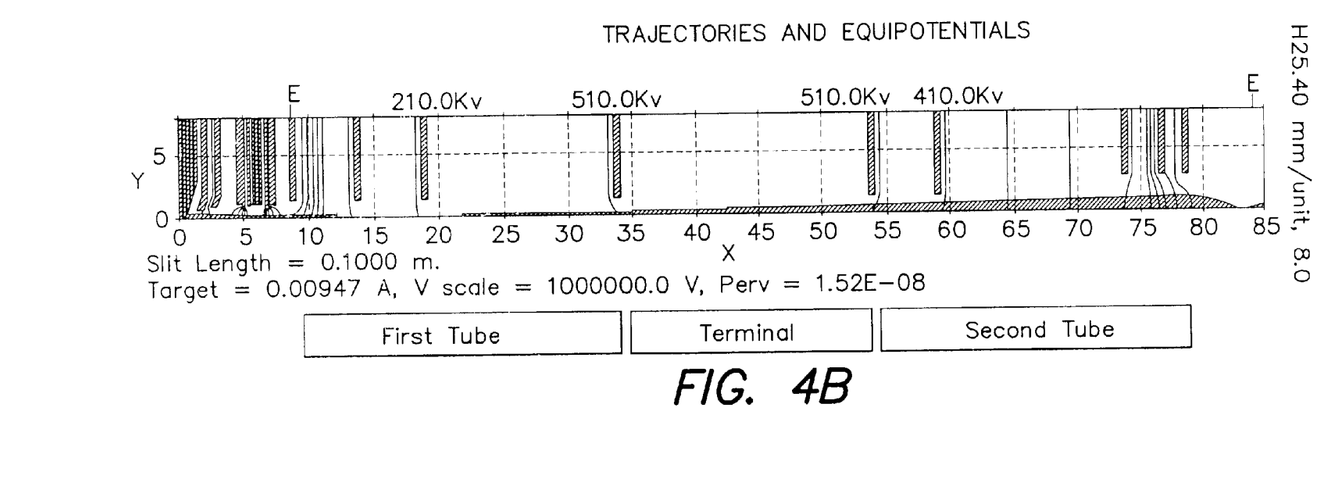
FIG. 4B is a graph showing the same ion beam of FIG. 4A injected into the same accelerating column with the terminal maintained at negative potential of −500 kV with no space charge neutralization.

The advantages of the invention for delivering high current, low energy ion beams for ion implantation with a tandem accelerator-based ion implanter are evident in computer simulations shown in FIGS. 4A and 4B. These advantages apply to the exemplary embodiments of the invention described previously, so long as the polarity of the accelerator terminal voltage is opposite to that of the beam charge state to be transported. The simulations were performed using the charged particle transport code PBGUNS (Thunderbird Simulations, Garland, Tex.).

FIG. 4A is a graph showing a sample case in which a 10 keV, 9.5 mA singly charged boron beam with an emittance of 70 π-mm-mrad and 98% space charge neutralization is injected into a typical tandem accelerating column with 25 inch long accelerating tubes and a 20 inch long high voltage terminal designed for a maximum terminal voltage of about 1 MV. In the simulation, no voltage is applied to the terminal. The beam is allowed to drift to the accelerator exit as in the prior art operating mode described previously. Even with the assumed high degree of space charge neutralization, the beam envelope is predicted to expand considerably along the length of the accelerating column due to the effects of beam space charge and emittance. The envelope reaches a size of about 3.6 inches at the terminal entrance and over 10 inches at the accelerator exit. Thus, the envelope size exceeds the size of typical stripping canals (<1 inch) and accelerating tube apertures (<3 inches) over most of the length of the accelerating column. It can be concluded from this simulation that a large fraction of the beam current will be lost as it traverses a typical tandem accelerating column.

FIG. 4B is a graph showing the same ion beam injected into the same accelerating column with the terminal maintained at negative potential of −500 kV. In this simulation, no space charge neutralization is assumed, and the boron beam charge state is the same along the entire length of the accelerating column. It is evident from the simulation that, even without any space charge neutralization, the ion beam is well-focused along the entire length of the accelerating column and is transported at a size compatible with unimpeded propagation through typical accelerating tube apertures and stripping canals.

Figure 5:
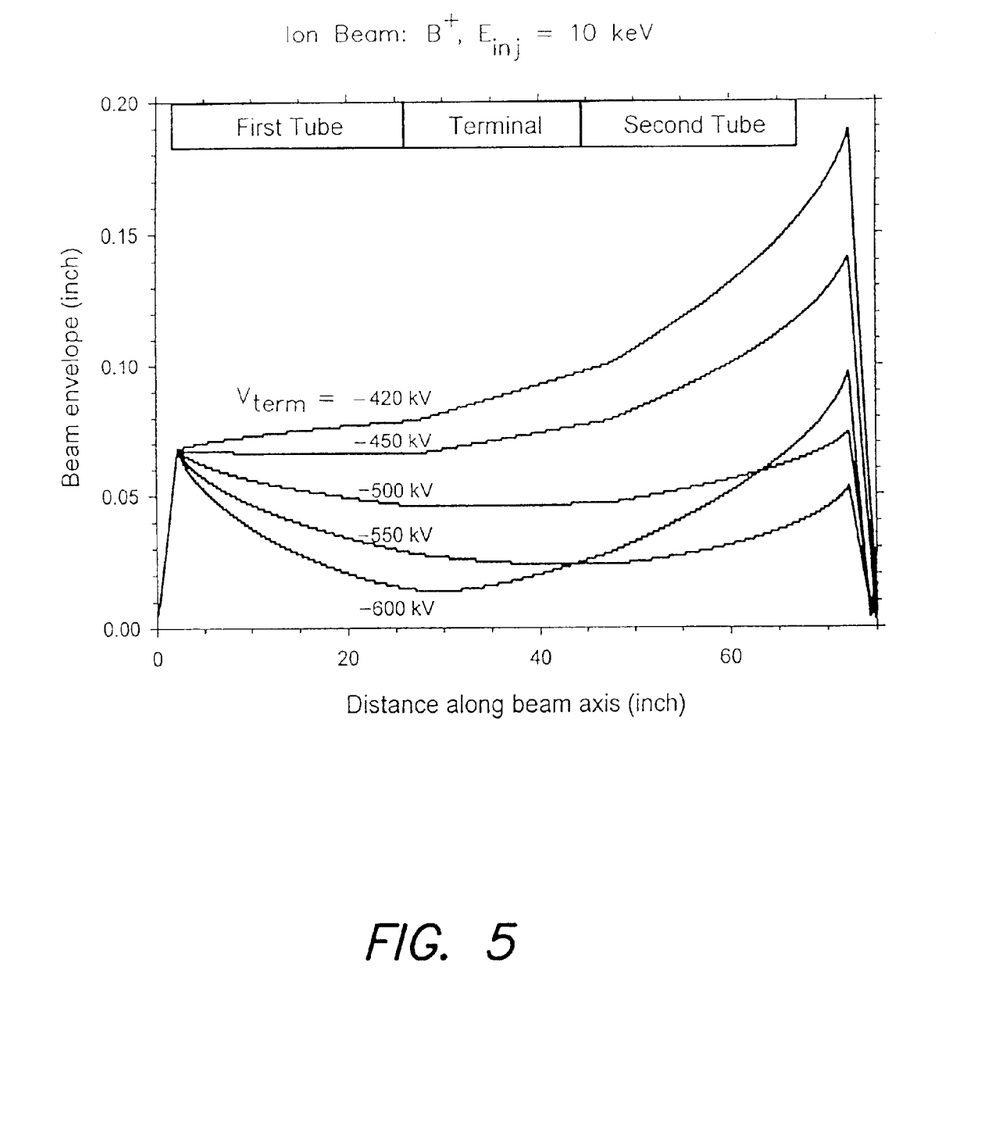
FIG. 5 is a graph showing simulations that, for fixed beam injection parameters, the beam envelope through the accelerator can be controlled by varying the terminal voltage.
Figure 6:
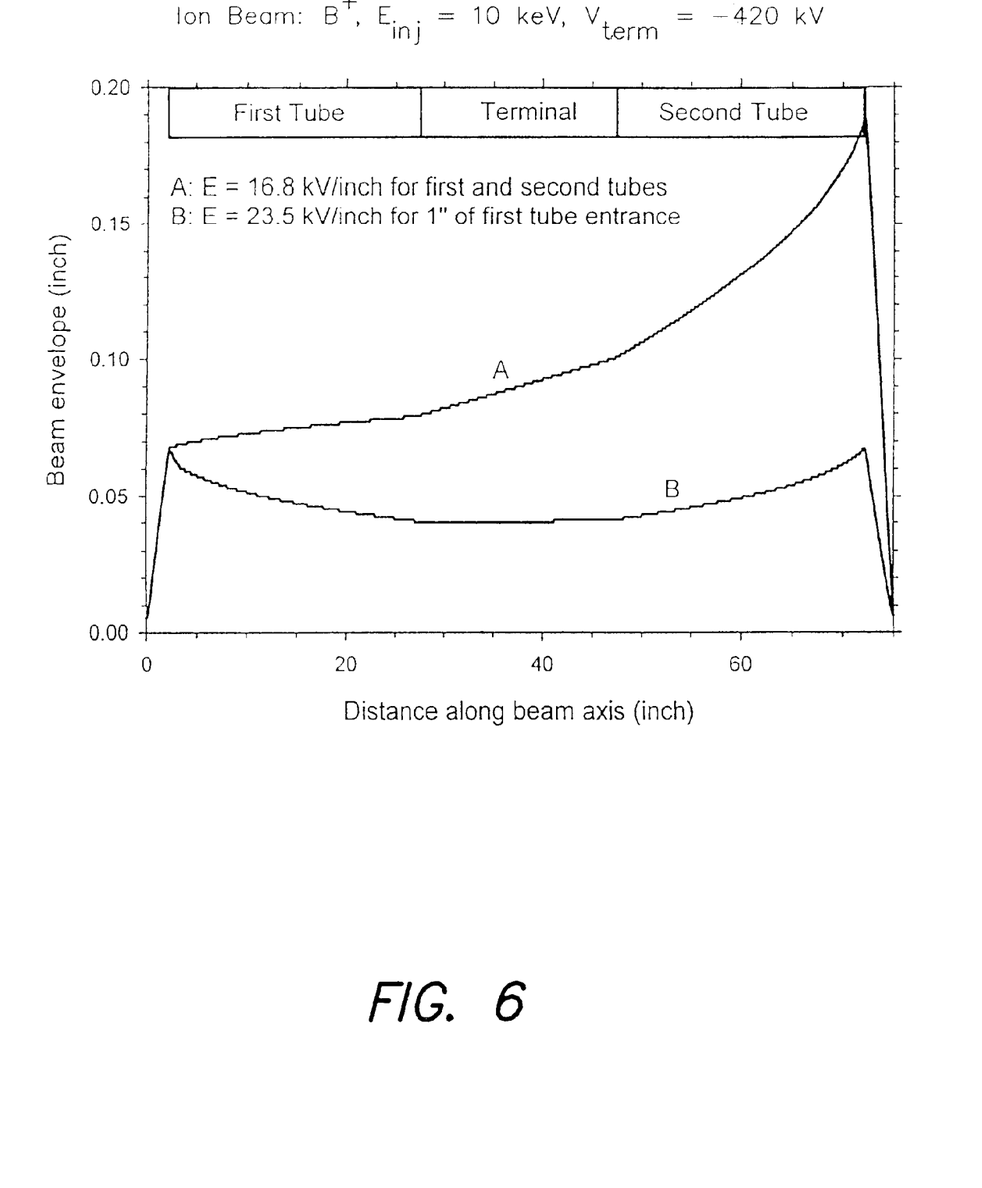
FIG. 6 is a graph showing simulations that, for fixed terminal voltage, the beam envelope can be further controlled by varying the electric field gradient near the entrance to the first accelerating tube.
Figure 7:
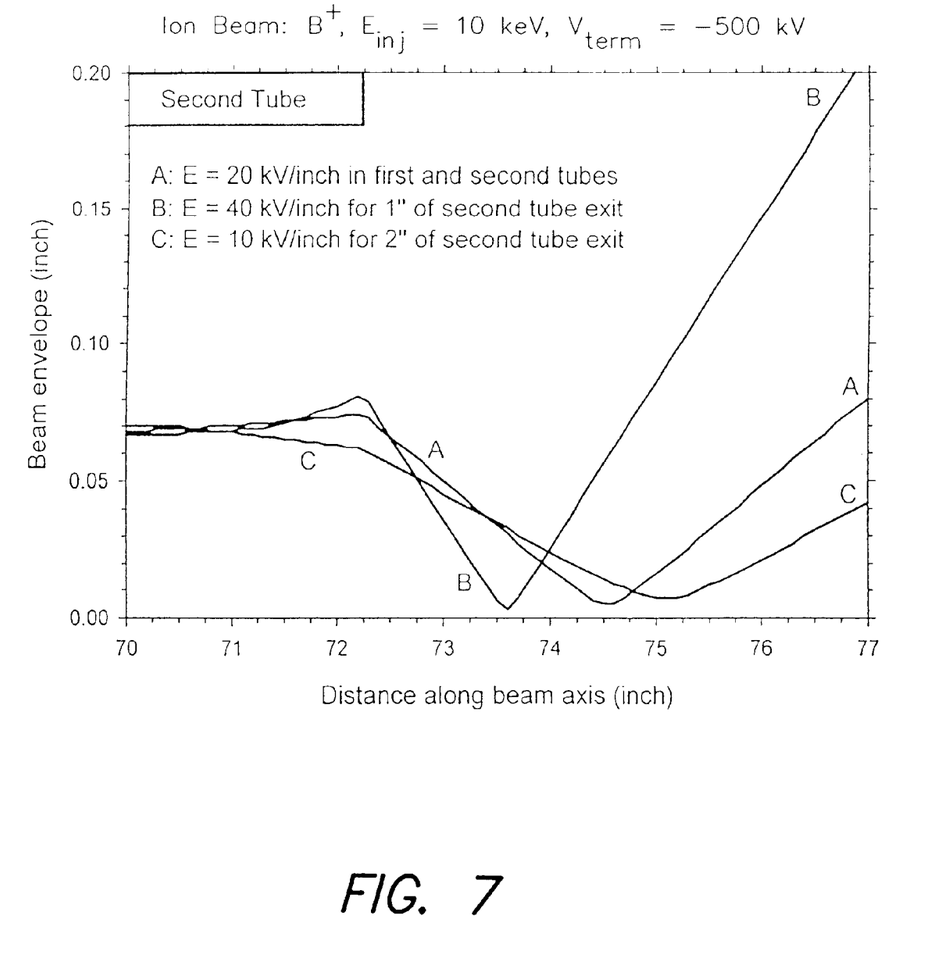
FIG. 7 is a graph showing simulations that, for fixed terminal voltage, the size and divergence angle of the beam envelope at the accelerator exit can be further controlled by varying the electric field gradient near the exit of the second accelerating tube.

Other aspects of the characteristics of the invention are shown in FIGS. 5–7 which show simulated beam envelopes for a low energy beam in a tandem accelerator with no stripping in the high voltage terminal. These simulations were performed using the OPTICII computer code (J. D. Larson, Nucl. Instrum. Meth. Vol. 122, 1974, p. 53), incorporated herein by reference.

FIG. 5 is a graph showing that, for fixed beam injection parameters, the beam envelope through the accelerator can be controlled by varying the terminal voltage. FIG. 5 shows simulations of transport of B+beams with $E_{inj}$=10 keV showing the effect of changing the terminal voltage.

FIG. 6 is a graph showing that, for fixed terminal voltage, the beam envelope can be further controlled by varying the electric field gradient near the entrance to the first accelerating tube. FIG. 6 shows simulations of transport of B+beams with $E_{inj}$10 keV showing the effect of changing the electric field gradient near the entrance of first accelerating tube for fixed terminal voltage of −420 kV.

FIG. 7 is a graph showing that, for fixed terminal voltage, the size and divergence angle of the beam envelope at the accelerator exit can be further controlled by varying the electric field gradient near the exit of the second accelerating tube. FIG. 7 shows simulations of transport of B+beams with $E_{inj}$=10 keV through a tandem accelerator with terminal voltage of −500 keV showing the effect of changing the electric field gradient near the exit of the second accelerating tube. For a given beam current, emittance, and injection energy, the electric filed gradients at the entrance and exit of one or both tubes can be adjusted to optimize the transport of the ion beam through the tandem accelerator.

When very low beam energies are required at the location of the process chamber, it may be desirable to propagate the beam from the accelerator exit to the process chamber at an energy higher than the injection energy in order to minimize beam expansion. Typical tandem accelerator-based ion implanters have focusing lenses and analyzing magnets in the exit beamline, as shown in FIG. 1. In the mode of low energy operation of the invention, it may be necessary for the beam to traverse a relatively long path from the accelerator exit to the process chamber. The invention provides a means for propagating the beam at an energy higher than $E_{inj}$ to a location close to the process chamber, and then decelerating the beam to $E_{inj}$ (or lower) close to the point of use. This is accomplished by electrically isolating the exit beamline from accelerator ground potential and from the process chamber, and maintaining the beamline at a voltage between the accelerator terminal voltage and ground. An example of this type of configuration is shown in FIG. 8.

Figure 8:
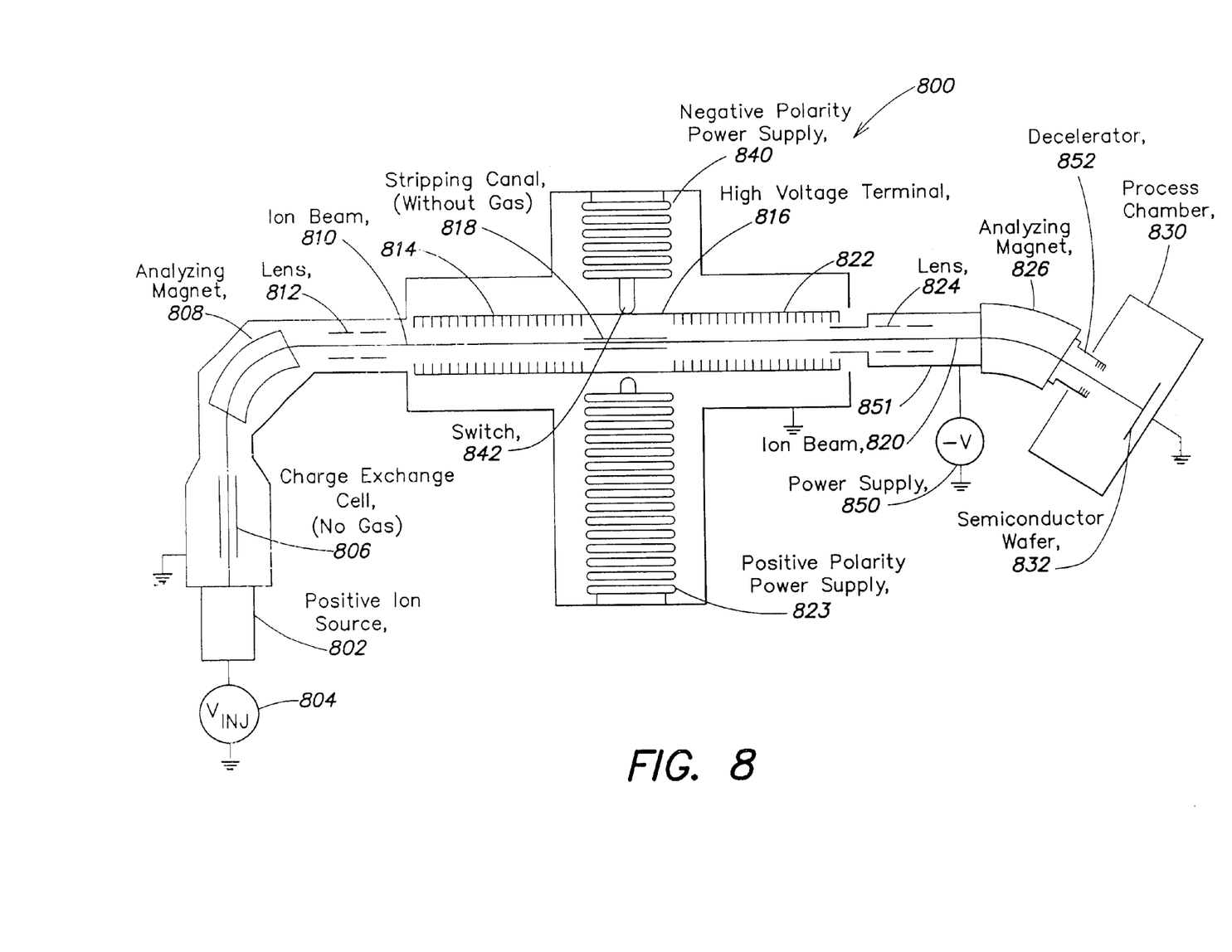
FIG. 8 is a functional block diagram of a tandem accelerator-based ion implanter configured with an exit beamline electrically isolated from accelerator ground and process chamber.

FIG. 8 is a functional block diagram of a tandem accelerator-based ion implanter 800 configured with an exit beamline 851 which is electrically isolated from accelerator ground and process chamber 830. A negative-terminal mode of operation is illustrated (see FIG. 3), with the further provision for supplying a negative voltage from power supply 850 to the exit beamline. In this case, the exit beamline is held at a negative potential whose magnitude is higher than the ion source potential. The accelerated ions are allowed to enter the exit beamline at an energy higher than the injection energy. A decelerator 852 is added to the downstream end of the exit beamline. The decelerator 852 further reduces the energy of the ion beam before it enters the process chamber.

In the example, the exit beamline is connected to the independent power supply 850 and the process chamber is maintained at ground potential. Alternately, the exit beamline can be connected electrically to one of the electrodes in the second accelerating tube 822 while at the same being electrically isolated from accelerator ground and from the process chamber. The beamline voltage is preferably low enough so that the beamline can be electrically isolated from any optical elements between the accelerator and process chamber, however this is not a requirement since these optical elements can alternately be designed to float to the beamline potential. Examples of such optical elements are focusing lenses 824 and analyzing magnets 826.

Beamline energies in the range 5 keV –40 keV will allow transport of the ion beam to the vicinity of the process chamber without excessive beam expansion, but energies higher or lower than this range could also be used. Before entering the grounded process chamber, the beam 820 passes through the decelerator 852 where it is decelerated to $E_{inj}$. The decelerator can comprise a single decelerating gap, or a series of decelerating gaps. In an exemplary embodiment, the process chamber is held at the same potential as the accelerator ground and the ion beam reaches an energy equal to $E_{inj}$ when it impinges on the piece to be implanted. Alternately, the piece to be implanted could be biased to a positive (negative) voltage for a positive (negative) beam to cause further deceleration of the beam to an energy lower than $E_{inj}$.

Figure 9:
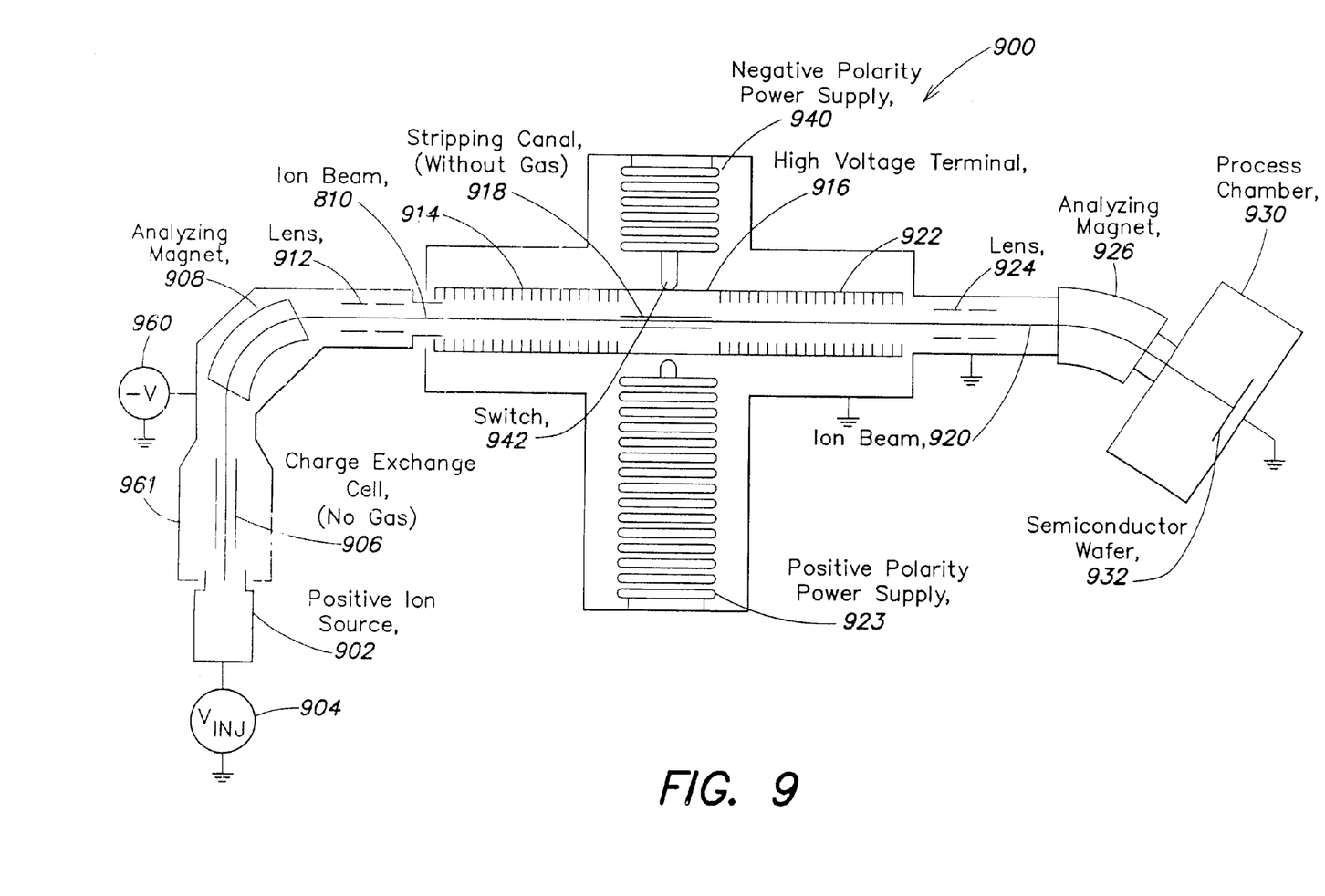
FIG. 9 is a functional block diagram of a tandem accelerator-based ion implanter configured with entrance beamline electrically isolated from accelerator and ion source by connecting the entrance beamline to an external power supply.

In the same way, the entrance beamline can also be isolated electrically from the ion source and accelerator ground in order to allow transport of the beam through the injector optical components at an energy higher than $E_{inj}$. FIG. 9 shows an example of such a configuration.

FIG. 9 is a functional block diagram of a tandem accelerator-based ion implanter 900 configured with an entrance beamline 951 electrically isolated from the accelerator and the ion source. A negative-terminal mode of operation is illustrated, with the further provision for supplying a negative voltage from power supply 960 to the entrance beamline. This figure shows another variation of the configuration of FIG. 3 in which the entrance beamline is electrically isolated from both the ion source and the first accelerating tube, and a voltage is applied independently to the entrance beamline. Alternately, the entrance beamline can be connected to one of the electrodes of the first accelerating tube 914. The entrance beamline can be electrically isolated from the injector optical components or the injector optical components can be designed to float to the beamline potential. A configuration having an isolated entrance beamline can be used in conjunction with a configuration having an isolated exit beamline, or these two configurations could be used separately.

Although the present invention has been shown and described with respect to several preferred embodiments thereof, various changes, omissions and additions to the form and detail thereof, may be made therein, without departing from the spirit and scope of the invention.

What is claimed is:

1. A method of generating an ion beam at low energy with an accelerator, comprising:
   providing an ion beam with an initial energy;
   accelerating said ion beam in a first accelerating tube to a high voltage terminal;
   transporting said ion beam through said terminal without significant charge changing; and
   decelerating said ion beam substantially to ground potential in a second accelerating tube.

2. The method of claim 1 further comprising adjusting optical parameters of said ion beam to produce a focused beam envelope in said accelerating tubes and said high voltage terminal, allowing the beam to propagate efficiently therethrough.

3. The method of claim 1, wherein said ion beam propagates through said first and second accelerator tubes at energies higher than said initial energy of said ion beam, thus expansion of the ion beam due to space charge and emittance is reduced.

4. The method of claim 1 further comprising adjusting optical parameters of said first and second accelerating tubes to further compensate for emittance and space charge effects.

5. The method of claim 1, wherein said ion beam reaches a grounded exit of said second accelerator tube with an energy substantially equal to said initial energy.

6. The method of claim 1, wherein said initial energy of said ion beam is in the range between about 100 eV to about 250 keV.

7. The method of claim 1 further comprising setting the voltage of said high voltage terminal to a value that provides efficient beam transport.

8. The method of claim 1 further comprising adjusting the electric field gradient at the entrance or exit or both of said first accelerator tube to a value that provides efficient beam transport.

9. The method of claim 1 further comprising adjusting the electric field gradient at the entrance or exit or both of said second accelerator tube to a value that provides efficient beam transport.

10. The method of claim 1 further comprising applying positive polarity voltage to said high voltage terminal when said ion, beam is negatively charged.

11. The method of claim 10 further comprising electrically isolating an exit beamline from accelerator ground and from a downline process chamber, and applying a positive voltage to the exit beamline in order to transport the beam to the vicinity of the process chamber at an energy higher than the initial energy, thus said ion beam is decelerated in said second accelerating tube to a potential which is positive with respect to ground.

12. The method of claim 10 further comprising electrically isolating an entrance beamline from an ion source and from accelerator ground, and applying a positive voltage to the entrance beamline.

13. The method of claim 1 further comprising applying negative polarity voltage to said high voltage terminal when said ion beam is positively charged.

14. The method of claim 13 further comprising electrically isolating an exit beamline from accelerator ground and from a downline process chamber, and applying a negative voltage to the exit beamline in order to transport the beam to the vicinity of the process chamber at an energy higher than the initial energy, thus said ion beam is decelerated in said second accelerating tube to a potential which is negative with respect to ground.

15. The method of claim 14 further comprising decelerating said ion beam with a decelerator to reduce energy prior to entering said process chamber.

16. The method of claim 13 further comprising electrically isolating an entrance beamline from an ion source and from accelerator ground, and applying a negative voltage to the entrance beamline.

17. The method of claim 1 wherein said ion beam comprises a high current ion beam.

18. The method of claim 1, wherein said accelerator comprises a tandem accelerator.

19. The method of claim 1, wherein said accelerator comprises a tandem accelerator based ion implanter.

20. The method of claim 1, wherein said ion beam comprises boron, phosphorus or arsenic.

21. An accelerator system for generating an ion beam at low energy comprising:
   an ion beam source for providing an ion beam with an initial energy;

a high voltage terminal and a power supply associated therewith;

a first accelerating tube for accelerating said ion beam to said high voltage terminal, said ion beam being transported through said terminal without significant charge changing; and a second accelerator tube for decelerating said ion beam substantially to ground potential.

22. The system of claim 21 further comprising optical components which adjust optical parameters of said ion beam to produce an focused beam envelope in said accelerating tubes and said high voltage terminal, thus allowing the beam to propagate efficiently therethrough.

23. The system of claim 21, wherein said ion beam propagates through said first and second accelerator tubes at energies,higher than said initial energy of said ion beam, thus expansion of the ion beam due to space charge and emittance is reduced.

24. The system of claim 21 further comprising optical components which adjust optical parameters of said first and second/accelerating tubes to further compensate for emittance and space charge effects.

25. The system of claim 21, wherein said ion beam reaches a grounded exit of said second accelerator tube with an energy substantially equal to said initial energy.

26. The system of claim 21, wherein said initial energy of said ion beam is in the range between about 100 eV to about 250 keV.

27. The system of claim 21, wherein the voltage of said high voltage terminal is set to a value that provides efficient beam transport.

28. The system of claim 21, wherein the electric field gradient at the entrance or exit or both of said first accelerator tube is adjusted to a value that provides efficient beam transport.

29. The system of claim 21, wherein the electric field gradient at the entrance or exit or both of said second accelerator tube is adjusted to a value that provides efficient beam transport.

30. The system of claim 21, wherein said power supply further comprises a positive polarity voltage supply which is applied to said high voltage terminal when said ion beam is negatively charged.

31. The system of claim 30 further comprising an exit beamline which is electrically isolated from accelerator ground and from a downline process chamber, and a positive voltage supply which is applied to the exit beamline in order to transport the beam to the vicinity of the process chamber at an energy higher than the initial energy, thus said ion beam is decelerated in said second accelerating tube to a potential which is positive with respect to ground.

32. The system of claim 30 further comprising an entrance beamline which is electrically isolated from an ion source and from accelerator ground, and a positive voltage supply which is applied to the entrance beamline.

33. The system of claim 21, wherein said power supply further comprises a negative polarity voltage supply which is applied to said high voltage terminal when said ion beam is positively charged.

34. The system of claim 33 further comprising an exit beamline which is electrically isolated from accelerator ground and from a downline process chamber, and a negative voltage supply which is applied to the exit beamline in order to transport the beam to the vicinity of the process chamber at an energy higher than the initial energy, thus said ion beam is decelerated in said second accelerating tube to a potential which is negative with respect to ground.

35. The system of claim 34 further comprising a decelerator for decelerating said ion beam to reduce energy prior to entering said process chamber.

36. The system of claim 33 further comprising an entrance beamline which is electrically isolated from an ion source and from accelerator ground, and a negative voltage supply which is applied to the entrance beamline.

37. The system of claim 21 wherein said power supply comprises a positive polarity voltage power supply and a negative polarity voltage supply.

38. The system of claim 37 further comprising means for connecting one of said positive and negative polarity power supplies to said high voltage terminal and disconnecting the other one from said terminal.

39. The system of claim 37, wherein both said positive and negative polarity power supplies are connected to said high voltage terminal.

40. The system of claim 21, wherein said ion beam comprises a high current ion beam.

41. The system of claim 21, wherein said accelerator comprises a tandem accelerator.

42. The system of claim 21, wherein said accelerator comprises a tandem accelerator-based ion implanter.

43. The system of claim 21, wherein said ion beam comprises boron, phosphorus or arsenic.

* * * * *